(12) United States Patent
Oh et al.

(10) Patent No.: US 11,388,841 B2
(45) Date of Patent: Jul. 12, 2022

(54) ELECTRONIC DEVICE INCLUDING HEAT DISSIPATION STRUCTURE

(71) Applicant: Samsung Electronics Co., Ltd., Suwon-si (KR)

(72) Inventors: Hyunmin Oh, Suwon-si (KR); Sungjin Park, Suwon-si (KR); Daegyu Kang, Suwon-si (KR); Insu Kim, Suwon-si (KR); Daegi Lee, Suwon-si (KR); Jonghyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/266,355

(22) PCT Filed: Jun. 24, 2019

(86) PCT No.: PCT/KR2019/007566
§ 371 (c)(1),
(2) Date: Feb. 5, 2021

(87) PCT Pub. No.: WO2020/032385
PCT Pub. Date: Feb. 13, 2020

(65) Prior Publication Data
US 2021/0321540 A1  Oct. 14, 2021

(30) Foreign Application Priority Data
Aug. 6, 2018  (KR) .................. 10-2018-0091204

(51) Int. Cl.
*H05K 7/20* (2006.01)
*H04R 1/02* (2006.01)
*H04R 9/02* (2006.01)

(52) U.S. Cl.
CPC .......... *H05K 7/20445* (2013.01); *H04R 1/02* (2013.01); *H04R 9/022* (2013.01)

(58) Field of Classification Search
CPC .......... H04R 5/02; H04R 5/023; H04R 5/025; H04R 2205/021; H04R 2499/15;
(Continued)

(56) References Cited

U.S. PATENT DOCUMENTS 4,914,551 A * 4/1990 Anschel .............. H01L 23/3675
257/713
7,262,369 B1 * 8/2007 English ................... H01L 23/04
174/370
(Continued)

FOREIGN PATENT DOCUMENTS

| JP | 2005-136250 A | 5/2005 |
| KR | 2003-0055812 A | 7/2003 |
| KR | 10-2013-0099688 A | 9/2013 |

OTHER PUBLICATIONS

Extended European Search Report dated Aug. 26, 2021, issued in European Patent Application No. 19848656.5.

*Primary Examiner* — Ahmad F. Matar
*Assistant Examiner* — Sabrina Diaz
(74) *Attorney, Agent, or Firm* — Jefferson IP Law, LLP

(57) ABSTRACT

An electronic device according to various embodiments of the disclosure includes: a housing including a plurality of acoustic holes; an enclosure mounted in the housing; at least one heating element disposed in the enclosure; a heat dissipation structure disposed on the heating element to transfer heat generated from the heating element; and a heat dissipation duct disposed at least partially on the heat dissipation structure to provide a path for transferring the heat transferred from the heat dissipation structure to the outside through the acoustic holes. The heat dissipation structure may include: at least one first heat transfer member coupled to the one heating element; and a second heat transfer member disposed at least partially on the first heat (Continued)

transfer member to transfer, to the heat dissipation duct, heat transferred from the first heat transfer member.

13 Claims, 8 Drawing Sheets

(58) Field of Classification Search
CPC .... H04R 2499/11; H04R 1/025; H04R 1/403; H04R 1/02; H04R 1/028; H04R 1/26; H04R 1/227; H04R 1/323; H04R 1/345; H04R 1/08; H04R 1/406; H04R 1/342; H04R 1/38; H04R 1/2819; H04R 1/2826; H04R 1/2842; H04R 1/28; H04R 1/026; H04R 1/021; H04R 2201/023; H04R 2201/021; H04R 3/12; H04R 9/022; H04S 7/40; H04M 1/03; B60R 11/0217; B60R 2011/0045; H05K 7/20445
USPC .................. 381/87, 386, 345, 332–336, 91
See application file for complete search history.

(56) References Cited

U.S. PATENT DOCUMENTS

| | | |
|---|---|---|
| 2013/0225065 A1 | 8/2013 | Lee |
| 2013/0329357 A1 | 12/2013 | Degner et al. |
| 2016/0295316 A1 | 10/2016 | Shao et al. |
| 2018/0152790 A1 | 5/2018 | Dong et al. |
| 2018/0192172 A1 | 7/2018 | Zhang et al. |
| 2018/0288525 A1* | 10/2018 | Katz ............... H04R 9/022 |
| 2020/0060043 A1* | 2/2020 | Lee ................. H05K 9/0024 |

* cited by examiner

ELECTRONIC DEVICE INCLUDING HEAT DISSIPATION STRUCTURE

TECHNICAL FIELD

Various embodiments of the disclosure relate to a heat dissipation structure of an electronic device.

BACKGROUND ART

The conventional electronic device may have at least one heating element such as a printed circuit board included therein, with a structure in which heat generated from the printed circuit board stays in a closed space of an enclosure since a heat dissipation structure for dissipating the heat is not provided inside the enclosure.

DISCLOSURE OF INVENTION

Technical Problem

Accordingly, the conventional electronic device does not have additional heat dissipation structure for dissipating heat generated therein to the outside, which results in a problem in that heat dissipation efficiency deteriorates.

Various embodiments of the disclosure has a heat dissipation duct and a heat dissipation structure for transferring heat generated therein to the outside of a housing, thereby providing an electronic device capable of efficiently dissipating internal heat to the outside.

Various embodiments of the disclosure uses a low-pitch or high-pitch amplifying device to pump internal heat to the outside, thereby providing an electronic device capable of effectively dissipating the heat.

Solution to Problem

An electronic device according to various embodiments of the disclosure includes: a housing including a plurality of acoustic holes; an enclosure mounted in the housing; at least one heating element disposed in the enclosure; a heat dissipation structure disposed on the heating element to transfer heat generated from the heating element; and a heat dissipation duct disposed at least partially on the heat dissipation structure to provide a path for transferring the heat transferred from the heat dissipation structure to the outside through the acoustic holes. The heat dissipation structure may include: at least one first heat transfer member coupled to the one heating element; and a second heat transfer member disposed at least partially on the first heat transfer member to transfer, to the heat dissipation duct, heat transferred from the first heat transfer member.

Advantageous Effects of Invention

According to various embodiments of the disclosure, heat generated from a heating element inside an electronic device can be efficiently dissipated to the outside of acoustic holes through a heat transfer path consisting of a heat dissipation structure and a heat dissipation duct.

BEST MODE FOR CARRYING OUT THE INVENTION

Figure 1:
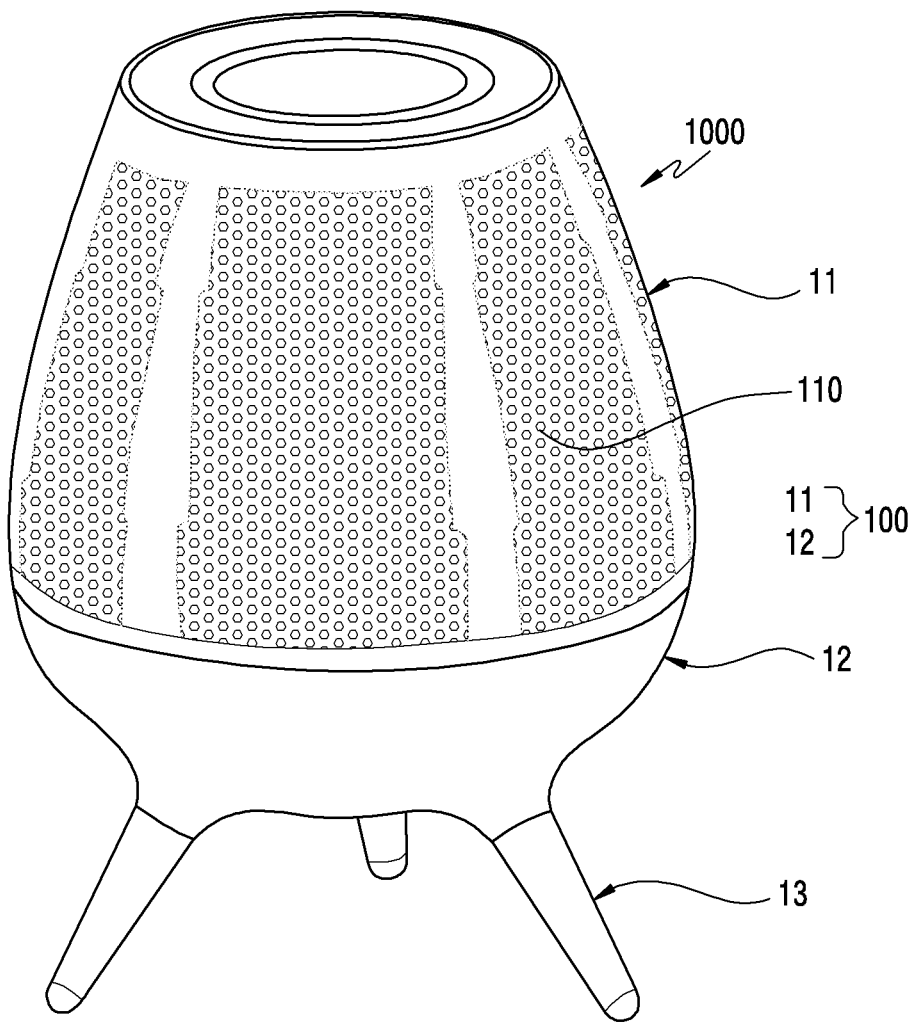
FIG. 1 is a perspective view illustrating an exterior of an electronic device according to various embodiments of the disclosure.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

FIG. 1 is a perspective view illustrating an exterior of an electronic device according to various embodiments of the disclosure.

Referring to FIG. 1, an electronic device 1000 according to various embodiments may include a desk-type speaker which can be mounted on a desk, as a speaker capable of radiating a high-pitch or low-pitch sound. In addition, the electronic device 1000 may be an Artificial Intelligence (AI) speaker having a built-in microphone device.

The electronic device 1000 according to various embodiments may include a housing 100 which constitutes an exterior and protects internal electronic components. The housing 100 may include an upper housing 11 and a lower housing 12. The housing 100 may include a plurality of leg portions 13 for mounting the device on a desk.

The upper housing 11 according to various embodiments may have a plurality of acoustic holes 110 constructed on an outer face. For example, each of the acoustic holes 110 may be constructed generally on the upper housing 11, and may be constructed equi-distantly. The acoustic holes 110 may be holes for transferring a sound radiated from a sound generating device (not shown) to the outside.

Figure 2:
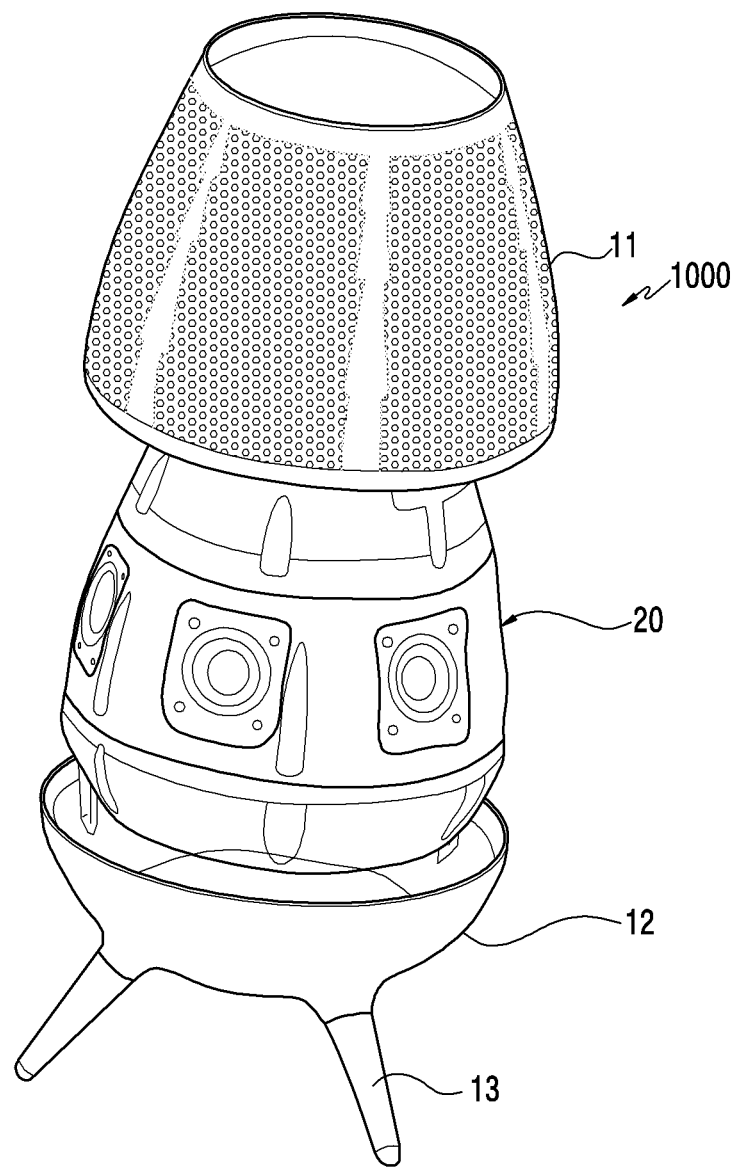
FIG. 2 is an exploded perspective view illustrating an enclosure disposed inside an electronic device according to various embodiments of the disclosure.

FIG. 2 is an exploded perspective view illustrating an enclosure disposed inside an electronic device according to various embodiments of the disclosure.

Referring to FIG. 2, a housing (e.g., the housing 100 of FIG. 1) of an electronic device (e.g., the electronic device 1000 of FIG. 1) according to various embodiments may include an enclosure 20. The enclosure 20 according to various embodiments may be an internal housing capable of accommodating and supporting electronic components, for example, a printed circuit board, a power supply unit, or the like. The enclosure 20 may be surrounded by upper and lower housings 11 and 12 so as to be protected and supported.

Figure 3:
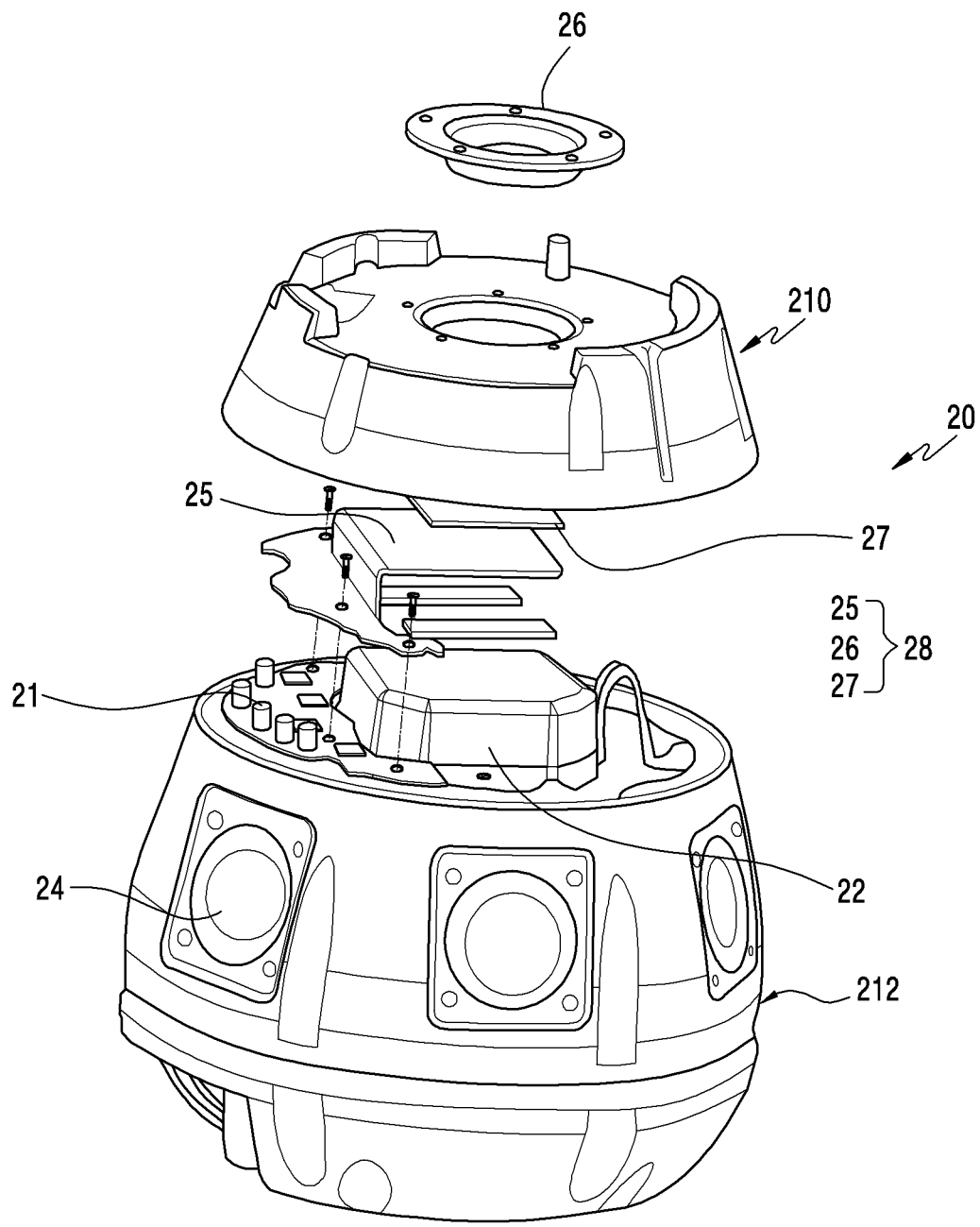
FIG. 3 is an exploded perspective view illustrating an inner structure of an enclosure according to various embodiments of the disclosure.

FIG. 3 is an exploded perspective view illustrating an inner structure of an enclosure according to various embodiments of the disclosure.

Referring to FIG. 3, an enclosure (e.g., the enclosure 20 of FIG. 2) according to various embodiments may include an upper enclosure 210 and a lower enclosure 212. The upper enclosure 210 may be coupled to the lower enclosure 212 by using at least one fastening structure. The enclosure 20 according to various embodiments may include a power supply unit 22, a heat dissipation structure 28, and at least one printed circuit board 21.

The enclosure 20 according to various embodiments may have the heat dissipation structure 28 accommodated in the upper enclosure 210. The heat dissipation structure 28 according to various embodiments may be a structure for transferring heat generated from the heating element 21 inside the enclosure 20 to the outside of acoustic holes 110. For example, the heating element 21 may include a printed circuit board, on which a plurality of electronic components are mounted, the power supply unit 22, or the like. The printed circuit board may include an electronic component for amplifying an audio signal.

The heat dissipation structure 28 according to various embodiments is a structure coupled to the at least one heating element 21 to provide a heat transfer path for dissipating heat generated from the heating element 21 to the outside of the housing, and may include at least one heat transfer member, a heat dissipation duct (e.g., a heat dissipation duct 33 of FIG. 5), a Thermal Interfacing Material (TIM) 27, or the like.

The heat dissipation structure 28 according to various embodiments is a structure which provides a heat transfer path for dissipating heat generated from a heating element to outside portion, and may be a structure capable of transferring heat generated from a high-temperature heating element to the outside (e.g., a relatively low-temperature portion).

The heat dissipation structure 28 according to various embodiments may include first and second heat transfer members 25 and 26. The first heat transfer member 25 may be a member coupled to the printed circuit board 21 dedicated for amplification so that heat generated from the printed circuit board 21 dedicated for amplification is transferred to another heat transfer element. For example, the first heat transfer member 25 may include a material (e.g., aluminum) of which a thermal conductive is higher than a designated range.

The second heat transfer member 26 according to various embodiments may be a heat transfer element coupled to the first heat transfer member 25 by means of the TIM so that heat generated from the first heat transfer member 25 is transferred to a heat dissipation duct. For example, the TIM may be disposed between the first and second heat transfer members 25 and 26, so that heat is effectively transferred between them. The TIM 27 may be a member which serves to eliminate a gap caused by tolerances of processing and assembling components. For example, the TIM 27 may include a silicone polymer material. The TIM 27 may serve to prevent a disjoint state, which may occur between the components when the electronic device 1000 operates.

Figure 4:
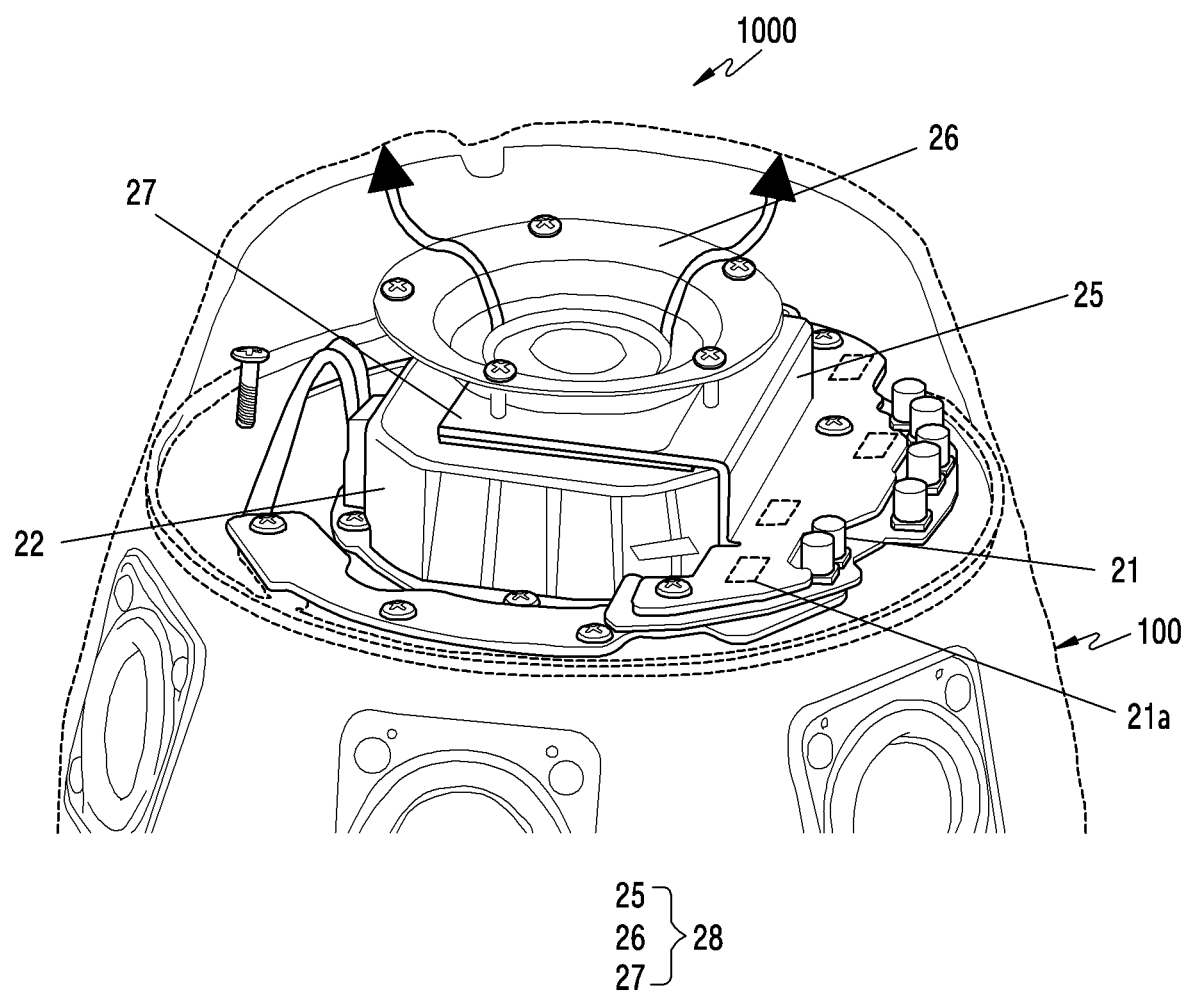
FIG. 4 is a cross-sectional view illustrating an inner structure of an electronic device according to various embodiments of the disclosure.
Figure 5:
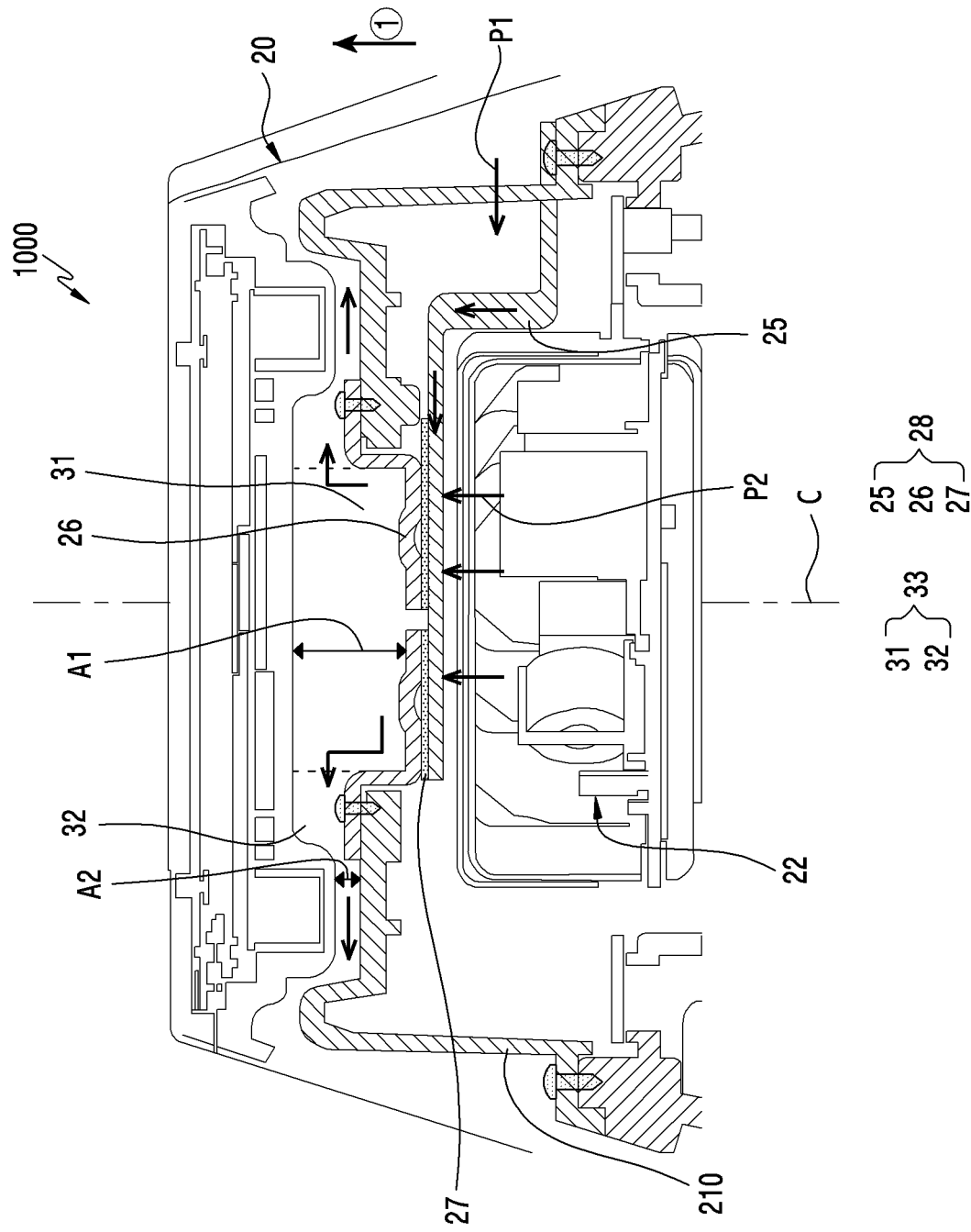
FIG. 5 is a cross-sectional view illustrating a heat dissipation structure of an electronic device according to various embodiments of the disclosure.

FIG. 4 is a cross-sectional view illustrating an inner structure of an electronic device according to various embodiments of the disclosure. FIG. 5 is a cross-sectional view illustrating a heat dissipation structure of an electronic device according to various embodiments of the disclosure.

A heat dissipation structure 28 of an electronic device 1000 according to various embodiments will be described with reference to FIG. 4 and FIG. 5.

With respect to a power supply unit (e.g., the power supply unit 22 of FIG. 3) disposed coaxially with a central axis C, an electronic device according to various embodiments (e.g., the electronic device 1000 of FIG. 1) may have a heat dissipation structure (e.g., the heat dissipation structure 28 of FIG. 3) disposed in a first direction of a power supply unit 22 and may have a heat dissipation duct (e.g., the heat dissipation duct 33 of FIG. 5) located at an upper portion of the heat dissipation structure 28 to dissipation heat to the outside.

The electronic device 1000 according to various embodiments may have at least one substrate (e.g., the printed circuit board 21 of FIG. 3) disposed in an outer circumferential direction of the power supply unit 22. For example, a printed circuit board 21 mounted inside the enclosure 20 may include a printed circuit board for amplifying a sound, a printed circuit board related to an operation of the electronic device, a printed circuit board for operating the power supply unit, or the like. Among the plurality of printed circuit boards, the printed circuit board dedicated for amplification may be disposed adjacent to the power supply unit 22, and may be disposed in an outer circumferential direction of the power supply unit 22. The printed circuit board 21 may be fastened to an enclosure 20 in a state of facing each other by means of a fastener.

The printed circuit board 21 according to various embodiments may be a first heating element, and the power supply unit 22 may be a second heating element. For example, among at least one or more printed circuit boards, heat generated from the printed circuit board dedicated for amplification is the most severe, and thus the first heating element may be the printed circuit board 21 dedicated for amplification. Heat generated from the printed circuit board 21 dedicated for amplification may be relatively higher than heat generated from the power supply unit. The power supply unit 22 may also include a printed circuit board.

According to various embodiments, at least one printed circuit board (e.g., a PCB) may include an audio signal amplifying circuit, an audio signal processing circuit, and a power supply circuit for supplying power. The circuit may be constructed as a separate printed circuit board.

The audio signal amplifying circuit of the printed circuit board 21 according to various embodiments may produce relatively higher heat than other circuits. The audio signal amplifying circuit or an area of the circuit may be a heating element.

In the electronic device 1000 according to various embodiments, the power supply unit 22 may be disposed to overlap with the heat dissipation structure 28, and the printed circuit board 21 may be disposed not to overlap with the heat dissipation structure 28. When viewed from above the enclosure 20, the power supply unit 22 and the heat dissipation structure 28 overlap, and the printed circuit board 21 may not overlap with the heat dissipation structure 28.

The heat dissipation structure 28 according to various embodiments may be disposed between a heat dissipation duct 33 and the power supply unit 22. Heat generated from the power supply unit 22 or printed circuit board 21 which is a heating element may be transferred by means of the heat dissipation structure 28, and thereafter may flow toward the outside of the plurality of acoustic holes 110 via the heat dissipation duct 33.

Since the heat generated from the power supply unit 22 or the printed circuit board 21 rises upward, the heat dissipation duct 33 provided by the heat dissipation structure 28 according to an embodiment may be disposed in a direction of acoustic holes (e.g., the acoustic holes 110 of FIG. 1) at an upper side of the power supply unit 22 or printed circuit board 21.

The heat dissipation structure 28 according to various embodiments may include first and second heat transfer members 25 and 26 and a TIM 27. Alternatively, the heat dissipation structure may include the heat dissipation duct 33 which provides a heat transfer path.

The heat dissipation duct 33 according to various embodiments may include a heat collecting unit 31 having a first cross-sectional area A1 and a heat transfer duct 32 having a second cross-sectional area A2. The first cross-sectional area A1 may be larger than the second cross-sectional area A2. Heat collected in the heat collecting unit 31 having the first cross-sectional area A1 is accelerated while flowing to the heat transfer duct 32 having the second cross-sectional area A2 smaller than the first cross-sectional area A1, so that the heat can be dissipated to the outside of the acoustic holes 110 with a speed.

Figure 6:
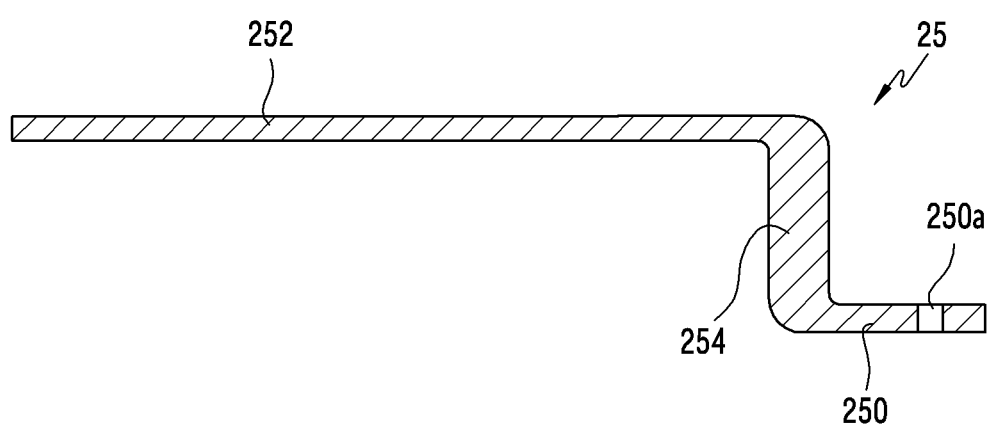
FIG. 6 is a cross-sectional view illustrating a first heat transfer member according to various embodiments of the disclosure.

A heating structure of the electronic device 1000 according to various embodiments may provide a first heat transfer path P1 in such a manner that heat generated from the printed circuit board 21 is dissipated to the outside of the acoustic holes 110 via the first heat transfer member 25, the TIM 27, the second heat transfer member 26, and the heat dissipation duct 33, and may provide a second heat transfer path P2 in such a manner that heat generated from the power supply unit 22 is dissipated to the outside of the acoustic holes 110 via the first heat transfer member 25, the TIM 27, the FIG. 6 is a cross-sectional view illustrating a first heat transfer member according to various embodiments of the disclosure.

Referring to FIG. 6, the first heat transfer member according to various embodiments (e.g., the first heat transfer member 25 of FIG. 3) may include a metal material, for example, a material (e.g., an aluminum material or a copper material) of which a heat transfer efficiency is higher than a designated range. The first heat transfer member 25 may include a plate shape which is bent at least once. The first heat transfer member 25 may have one portion 250 fastened to a printed circuit board (e.g., the printed circuit board 21 of FIG. 3) by means of a fastener, and may have the other end portion 252 coupled to a first TIM (e.g., the TIM 27 of FIG. 3). Heat generated from the printed circuit board 21 may be transferred to the TIM 27 by means of the first heat transfer member 25. The one end portion 250 and the other end portion 252 may be integrally coupled by means of a connection portion 254. The first heat transfer member 25 may be manufactured by being bent at least once. The one end portion 250 and the other end portion 252 may be disposed in a substantially horizontal state, and the connection portion 254 may be disposed in a substantially vertical state.

The TIM 27 according to various embodiments may be disposed in a state of being closely in contact with first and second heat transfer members (e.g., the first and second heat transfer members 25 and 26 of FIG. 3). A first face facing a first direction of the TIM 27 may be disposed in a state of being closely in contact with the second heat transfer member (e.g., the second heat transfer member 26 of FIG. 3), and a second face facing a second direction may be disposed in a state of being closely in contact with the first heat transfer member 25. The TIM 27 may serve for a function of transferring heat, which is transferred from the first heat transfer member 25, to the second heat transfer member 26, and may serve for a function of a connection member which couples the first and second heat transfer members 25 and 26.

Figure 7:
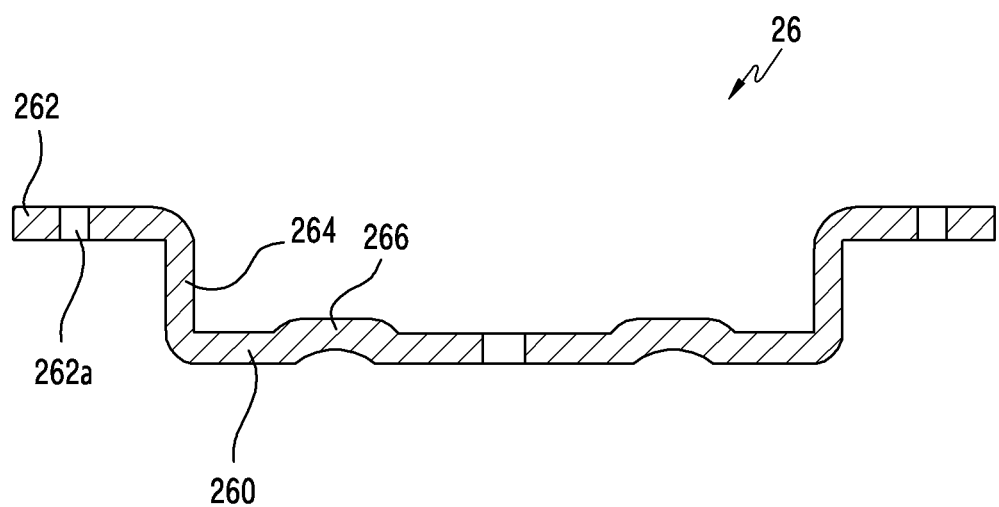
FIG. 7 is a cross-sectional view illustrating a second heat transfer member according to various embodiments of the disclosure.

FIG. 7 is a cross-sectional view illustrating a second heat transfer member according to various embodiments of the disclosure.

Referring to FIG. 7, the second heat transfer member according to various embodiments (e.g., the second heat transfer member 26 of FIG. 3) may be constructed of a metal material, for example, an aluminum material having good heat transfer efficiency. The second heat transfer member 26 may have a hat shape which is advantageous to collect the transferred heat and spread it to acoustic holes (e.g., the acoustic holes 110 of FIG. 1).

The second heat transfer member 26 according to an embodiment may serve for a function which collects heat transferred from a TIM (e.g., the TIM 27 of FIG. 3) to transfer it to a heat dissipation duct (e.g., the heat dissipation duct 33 of FIG. 5). For example, it may be disposed coaxially with a power supply unit (e.g., the power supply unit 22 of FIG. 3) along a central axis C.

The second heat transfer member 26 according to various embodiments may include a first portion 260 which is closely in contact with the TIM 27, a second portion 262 which is fastened with an upper enclosure (e.g., the enclosure 20 of FIG. 3), and a third portion 264 which couples the first and second portions 260 and 262. The first and second portions 260 and 262 may be disposed in a substantially horizontal state, and the third portion 264 may be disposed in a substantially vertical state. For example, the first to third portions 260, 262, and 264 may be integrally manufactured.

The second heat transfer member 26 according to various embodiments may have a protrusion 266 constructed in the first portion 260. For example the protrusion 266 may have a ring shape.

The protrusion 266 according to various embodiments is not necessarily limited to being constructed in the first portion 260, and may be additionally constructed to maximize a surface area in contact with heat in the second portion 262 or the third portion 264. A plurality of fastening holes 262*a* for fastening with one portion of the upper enclosure 210 may be constructed in the second portion 262 of the second heat transfer member 26 according to various embodiments.

According to various embodiments, an electronic device (e.g., the electronic device 1000 of FIG. 1) may include: a housing (e.g., the housing 100 of FIG. 1) including a plurality of acoustic holes (e.g., the acoustic holes 110 of FIG. 1); an enclosure (e.g., the enclosure 20 of FIG. 2) mounted in the housing; at least one heating element (e.g., the printed circuit board 21 of FIG. 3) disposed in the enclosure; a heat dissipation structure (e.g., the heat dissipation structure 28 of FIG. 3) disposed on the heating element to transfer heat generated from the heating element; and a heat dissipation duct (e.g., the heat dissipation duct 33 of FIG. 5) disposed at least partially on the heat dissipation structure to provide a path for transferring the heat transferred from the heat dissipation structure to the outside through the acoustic holes. The heat dissipation structure may include: at least one first heat transfer member (e.g., the first heat transfer member 25 of FIG. 5) coupled to the one heating element; and a second heat transfer member (e.g., the second heat transfer member 26 of FIG. 5) disposed at least partially on the first heat transfer member to transfer, to the heat dissipation duct, heat transferred from the first heat transfer member.

According to various embodiments, the heating element may include: a power supply unit (e.g., the power supply unit 22 of FIG. 3) disposed in the enclosure (e.g., the enclosure 20 of FIG. 2); and at least one substrate (e.g., the substrate 21 of FIG. 3) disposed adjacent to the power supply unit.

According to various embodiments, at least one Thermal Interfacing Material (TIM) (e.g., the TIM 27 of FIG. 5) may be further disposed between the first and second heat transfer members (e.g., the first and second heat transfer members 25 and 26 of FIG. 5).

According to various embodiments, the TIM (e.g., the TIM 27 of FIG. 5) may be closely in contact with each of the first and second heat transfer members (e.g., the first and second heat transfer members 25 and 26 of FIG. 5).

According to various embodiments, the first heat transfer member (e.g., the first heat transfer member 25 of FIG. 5) may include: one end portion (e.g., the one end portion 250 of FIG. 6), which is disposed in a substantially horizontal state, in contact with the substrate; the other end portion (e.g., the other end portion 252 of FIG. 6), which is disposed in a substantially horizontal state, having a gap with respect to an upper face of the power supply unit (e.g., the power supply unit 22 of FIG. 3); and a connection portion (e.g., the connection portion 254 of FIG. 6), which is disposed in a substantially vertical state, constructed by being bent at each of the one end portion and the other end portion, and disposed to have a gap with respect to a side face of the power supply unit.

According to various embodiments, the other end portion (e.g., the other end portion 252 of FIG. 6) may be closely in contact with the TIM (e.g., the TIM 27 of FIG. 5).

According to various embodiments, the second heat transfer member (e.g., the second heat transfer member 26 of FIG. 7) having a shape of collecting heat may include: a substantially horizontal first portion (e.g., the first portion 260 of FIG. 7) which is disposed closely in contact with the TIM (e.g., the TIM 27 of FIG. 5); a substantially horizontal second portion (e.g., the second portion 262 of FIG. 7) which is fastened with the enclosure; and a third portion (e.g., the third portion 264 of FIG. 7) which couples between the first and second portions.

According to various embodiments, heat transferred in the heat dissipation duct (e.g., the heat dissipation duct 33 of FIG. 5) may be collected by the first and second portions (e.g., the first and second portions 260 and 262 of FIG. 7).

According to various embodiments, the first portion (e.g., the first portion 260 of FIG. 7) may further include a ring-shaped protrusion (e.g., the protrusion 266 of FIG. 7).

According to various embodiments, the protrusion (e.g., the protrusion 266 of FIG. 7) may protrude towards the heat dissipation duct (e.g., the heat dissipation duct 33 of FIG. 5).

According to various embodiments, the heat dissipation duct (e.g., the heat dissipation duct 33 of FIG. 5) may include: a heat collecting unit (e.g., the heat collecting unit 31 of FIG. 5) having a first cross-sectional area to collect heat transferred from the one or more heat transfer members (e.g., the first and second heat transfer members 25 and 26 of FIG. 5); and a heat transfer duct (e.g., the heat transfer duct 32 of FIG. 5) which dissipates heat of the heat collecting unit to the acoustic holes (e.g., the acoustic holes 110 of FIG. 1) and having a second cross-sectional area smaller than the first cross-sectional area.

According to various embodiments, the electronic device may further include: a first heat transfer path (e.g., the first heat transfer path P1 of FIG. 5) which dissipates heat generated from the substrate (e.g., the substrate 210 of FIG. 3) to the outside of the acoustic holes (e.g., the acoustic holes 110 of FIG. 1) through the first heat transfer member (e.g., the first heat transfer member 25 of FIG. 5), the TIM (e.g., the TIM 27 of FIG. 5), the second heat transfer member (e.g., the second heat transfer member 26 of FIG. 5), and the heat dissipation duct (e.g., the heat dissipation duct 33 of FIG. 5); and a second heat transfer path (e.g., the second heat transfer path P2 of FIG. 5) which dissipates heat generated from the power supply unit (e.g., the power supply unit 220 of FIG. 5) to the outside of the acoustic holes through the first heat transfer member (e.g., the first heat transfer member 25 of FIG. 5), the first TIM (e.g., the TIM 27 of FIG. 5), the second heat transfer member (e.g., the second heat transfer member 26 of FIG. 5), and the heat dissipation duct (e.g., the heat dissipation duct 33 of FIG. 5).

According to various embodiments, each of the first and second heat transfer members (e.g., the first and second heat transfer members 25 and 26 of FIG. 5) may include at least part of an aluminum material or a copper material.

According to various embodiments, the TIM (e.g., the TIM 27 of FIG. 5) may include a silicon polymer material.

According to various embodiments, the second heat transfer member (e.g., the second heat transfer member 26 of FIG. 5) may include a hat shape.

Figure 8:
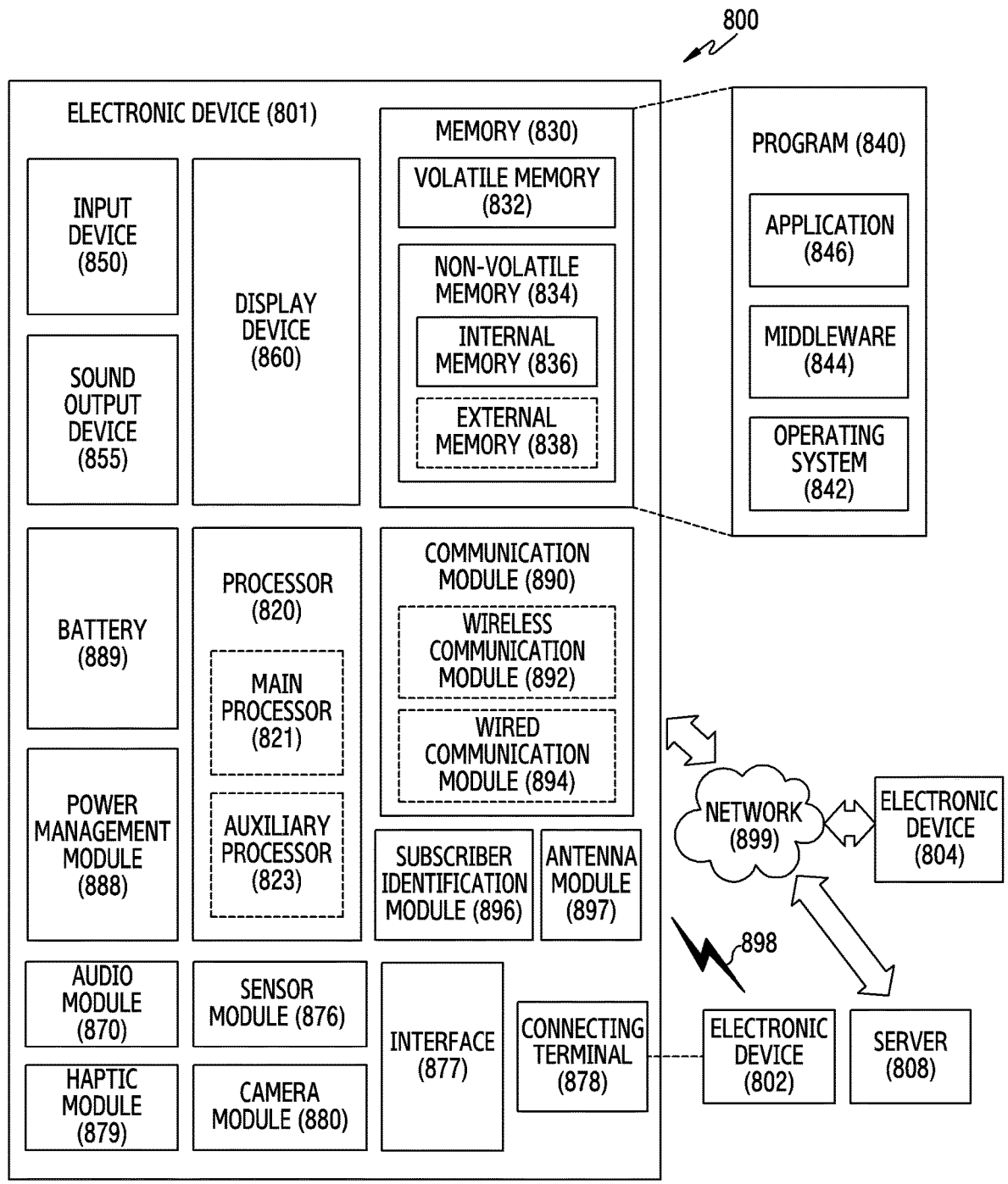
FIG. 8 is a block diagram illustrating an electronic device in a network environment according to various embodiments.

FIG. 8 is a block diagram illustrating an electronic device 801 in a network environment 800 according to various embodiments.

Referring to FIG. 8, the electronic device 801 (e.g., the electronic device 1000 of FIG. 1) in the network environment 800 may communicate with an electronic device 802 via a first network 898 (e.g., short-range wireless communication), or an electronic device 804 or a server 808 via a second network 899 (e.g., long-range wireless communication). According to an embodiment, the electronic device 801 may communicate with the electronic device 804 via the server 808. According to an embodiment, the electronic device 801 may include a processor 820, a memory 830, an input device 850, a sound output device 855, a display device 860, an audio module 870, a sensor module 876, an interface 877, a haptic module 879, a camera module 880, a power management module 888, a battery 889, a communication module 890, a Subscriber Identification Module (SIM) 896, or an antenna module 897. In some embodiments, at least one (e.g., the display device 860 or the camera module 880) of the components may be omitted from the electronic device 801, or one or more other components may be added in the electronic device 801. In some embodiments, some of the components may be implemented in an integrated manner, for example, as in a case of the sensor module 876 (e.g., a fingerprint sensor, an iris sensor, or an illuminance sensor) embedded in the display device 860 (e.g., a display).

The processor 820 may drive, for example, software (e.g., a program 840) to control at least one other component (e.g., a hardware or software component) of the electronic device 801 coupled with the processor 820, and may perform various data processing or computation. The processor 820 may load a command or data received from other components (e.g., the sensor module 876 or the communication module 890) in a volatile memory 832, process the command or the data stored in the volatile memory 832, and store resulting data in a non-volatile memory 834. According to an embodiment, the processor 820 may include a main processor 821 (e.g., a Central Processing Unit (CPU) or an Application Processor (AP)), and an auxiliary processor 823 (e.g., a Graphics Processing Unit (GPU), an Image Signal Processor (ISP), a sensor hub processor, or a Communication Processor (CP)) that is operable independently from, or in conjunction with, the main processor 821. Additionally or alternatively, the auxiliary processor 823 may be adapted to consume less power than the main processor 821, or to be specific to a specified function. Herein, the auxiliary processor 823 may be implemented as separate from, or imbedded in the main processor 821.

In this case, the auxiliary processor 823 may control at least some of functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). According to an embodiment, the auxiliary processor 823 (e.g., an image signal processor or a communication processor) may be implemented as part of another component (e.g., the camera module 880 or the communication module 890) functionally related to the auxiliary processor 823. The memory 830 may store various data, for example, software (e.g., the program 840) and input data or output data for a command related thereto, used by at least one component (e.g., the processor 820 or the sensor module 876) of the electronic device 801. The memory 830 may include the volatile memory 832 or the non-volatile memory 834.

The program 840 may be stored in the memory 830 as software, and may include, for example, an Operating System (OS) 842, middleware 844, or an application 846.

The input device 850 may be a device for receiving a command or data to be used by a component (e.g., the processor 820) of the electronic device 801 from the outside (e.g., a user) of the electronic device 801, and may include, for example, a microphone, a mouse, or a keyboard.

The sound output device 855 may be a device for outputting sound signals to the outside of the electronic device 801, and may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 860 may be a device for visually provide information to a user of the electronic device 801, and may include, for example, a display, a hologram device, or a projector and control circuitry to control a corresponding device. According to an embodiment, the display device 860 may include touch circuitry or a pressure sensor adapted to measure the intensity of force incurred by the touch.

The audio module 870 may convert a sound into an electrical signal and vice versa. According to an embodiment, the audio module 870 may obtain the sound via the input device 850, or output the sound via the sound output device 855 or, for example, an external electronic device (e.g., an electronic device 802, for example, a speaker or a headphone)) wiredly or wirelessly coupled with the electronic device 801.

The sensor module 876 may generate an electrical signal or data value corresponding to an internal operational state (e.g., power or temperature) of the electronic device 801 or an external environmental state. The sensor module 876 may include, for example, a gesture sensor, a gyro sensor, an atmospheric pressure sensor, a magnetic sensor, an acceleration sensor, a grip sensor, a proximity sensor, a color sensor, an Infrared (IR) sensor, a biometric sensor, a temperature sensor, a humidity sensor, or an illuminance sensor.

The interface 877 may support a specified protocol to be coupled with the external electronic device (e.g., the electronic device 802) wiredly or wirelessly. According to an embodiment, the interface 877 may include, for example, a High Definition Multimedia Interface (HDMI), a Universal Serial Bus (USB) interface, a Secure Digital (SD) card interface, or an audio interface.

A connection terminal 878 may include a connector via which the electronic device 801 may be physically connected with the external electronic device (e.g., the electronic device 802), and may include, for example, a HDMI connector, a USB connector, an SD card connector, or an audio connector (e.g., a headphone connector).

The haptic module 879 may convert an electrical signal into a mechanical stimulus (e.g., a vibration or a movement) or electrical stimulus which may be recognized by a user via tactile sensation or kinesthetic sensation. The haptic module 879 may include, for example, a motor, a piezoelectric element, or an electric stimulator.

The camera module 880 may capture still images or moving images. According to an embodiment, the camera module 880 may include one or more lenses, image sensors, image signal processors, or flashes.

The power management module 888 may be a module for managing power supplied to the electronic device 801, and may be implemented as at least part of, for example, a Power Management Integrated Circuit (PMIC).

The battery 889 may be a device for supplying power to at least one component of the electronic device 801, and may include, for example, a primary cell which is not rechargeable, a secondary cell which is rechargeable, or a fuel cell.

The communication module 890 may support establishing a wired communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the Application Processor (AP)) and supports a wired communication or a wireless communication. According to an embodiment, the communication module 890 may include a wireless communication module 892 (e.g., a cellular communication module, a short-range wireless communication module, or a Global Navigation Satellite System (GNSS) communication module) or a wired communication module 894 (e.g., a Local Area Network (LAN) communication module or a Power Line Communication (PLC) module). A corresponding one of these communication modules may communicate with the external electronic device via the first network 898 (e.g., a short-range communication network, such as Bluetooth™, Wireless-Fidelity (Wi-Fi) direct, or Infrared Data Association (IrDA) or the second network 899 (e.g., a long-range communication network, such as a cellular network, the Internet, or a computer network (e.g., LAN or Wide Area Network (WAN)). These various types of the communication modules 890 may be implemented as a single chip, or may be implemented as chips separate from each other.

According to an embodiment, the wireless communication module 892 may identify and authenticate the electronic device 801 in a communication network by using user information stored in the subscriber identification module 896.

The antenna module 897 may include one or more antennas for transmitting or receiving a signal or power to or from the outside. According to an embodiment, the communication module 890 (e.g., the wireless communication module 892) may transmit or receive a signal to or from the external electronic device via an antenna appropriate for a communication scheme.

At least some of the above-described components may be coupled mutually and communicate signals (e.g., commands or data) therebetween via an inter-peripheral communication scheme (e.g., a bus, General Purpose Input and Output (GPIO), Serial Peripheral Interface (SPI), or Mobile Industry Processor Interface (MIPI)).

According to an embodiment, commands or data may be transmitted or received between the electronic device 801 and the external electronic device 804 via the server 808 coupled with the second network 899. Each of the electronic devices 802 and 804 may be a device of a same type as, or a different type from, the electronic device 801. According to an embodiment, all or some of operations to be executed at the electronic device 801 may be executed at one or more of the external electronic devices. According to an embodiment, if the electronic device 801 should perform a function or a service automatically, or in response to a request, the electronic device 801, instead of, or in addition to, executing the function or the service, may request the one or more external electronic devices to perform at least part of the function or the service. The external electronic devices receiving the request may perform the requested function or an additional function, and transfer an outcome of the performing to the electronic device 801. The electronic device 801 may provide the requested function or service, with or without further processing of the outcome. To that end, a cloud computing, for example, distributed computing, or client-server computing technology may be used.

The electronic device according to various embodiments disclosed in the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device is not limited to the aforementioned devices.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. A singular expression may include a plural expression unless there is a contextually distinctive difference. In the disclosure, expressions such as "A or B", "at least one of A and/or B", "A, B, or C", or "at least one of A, B, and/or C" may include all possible combinations of items enumerated together. Expressions such as "1st" and "2nd" or "first" and "second" may be used to simply distinguish a corresponding component from another, and does not limit the component in other aspect (e.g., importance or order). When a certain (e.g., 8st) component is mentioned as being "operatively or communicatively coupled with/to" or "connected to" a different (e.g., 2nd) component, the certain component is directly coupled with/to another component or can be coupled with/to the different component via another (e.g., 3rd) component.

As used herein, the term "module" may include a unit implemented in hardware, software, or firmware, and may interchangeably be used with other terms, for example, "logic", "logic block", "component", or "circuitry". The module may be a single integral component, or a minimum unit or part thereof, adapted to perform one or more functions. For example, the module may be implemented with an Application-Specific Integrated Circuit (ASIC).

Various embodiments of the disclosure may be implemented as software (e.g., the program 840) including instructions that are stored a storage medium (e.g., the internal memory 836 or the external memory 838) that is readable by a machine (e.g., a computer). The machine may include an electronic device (e.g., the electronic device 801) according to the disclosure embodiments, as a device which invokes the stored instructions from the medium and is operable according to the instruction invoked. When the instruction is executed by a processor (e.g., the processor 820), the processor may perform a function corresponding to the instruction by using other components directly or under the control of the processor. The instruction may include a code generated or executed by a complier or an interpreter. The machine-readable storage medium may be provided in the form of a non-transitory storage medium. Herein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may include a single entity or multiple entities. According to various embodiments, some of the above-described sub components may be omitted, or other sub components may be further included. Alternatively or additionally, some components (e.g., modules or programs) may be integrated into a single entity, and thus may perform functions in the same or similar manner as they are performed by corresponding respective components before the integration. According to various embodiments, operations performed by the module, the program, or another component may be carried out sequentially, in parallel, repeatedly, or heuristically, or at least some operations may be executed in a different order or omitted, or other operations may be added.

The invention claimed is:
1. An electronic device comprising:
a housing comprising a plurality of acoustic holes;
an enclosure mounted in the housing;
at least one heating element disposed in the enclosure;

a heat dissipation structure disposed on the at least one heating element to transfer heat generated from the at least one heating element; and a heat dissipation duct disposed at least partially on the heat dissipation structure to provide a path for transferring heat from the heat dissipation structure to outside the housing through the plurality of acoustic holes, wherein the heat dissipation structure comprises:
  at least one first heat transfer member coupled to the at least one heating element; and
  a second heat transfer member disposed at least partially on the at least one first heat transfer member to transfer, to the heat dissipation duct, heat from the first heat transfer member, wherein the at least one heating element comprises:
  a power supply disposed in the enclosure; and
  at least one substrate disposed adjacent to the power supply, and wherein the at least one first heat transfer member comprises:
  one end portion, which is disposed in a substantially horizontal state, in contact with the at least one substrate;
  another end portion, which is disposed in a substantially horizontal state, having a gap with respect to an upper face of the power supply; and
  a connection portion, which is disposed in a substantially vertical state, bent at each of the one end portion and the other end portion, and having a gap with respect to a side face of the power supply.

2. The electronic device of claim 1, wherein at least one thermal interfacing material (TIM) is disposed between the at least one first heat transfer member and the second heat transfer member.

3. The electronic device of claim 2, wherein the at least one TIM is in close contact with each of the at least one first heat transfer member and the second heat transfer member.

4. The electronic device of claim 1, wherein the other end portion is in close contact with a thermal interfacing material (TIM).

5. The electronic device of claim 1,
wherein the second heat transfer member comprises a shape for collecting heat, and
wherein the second heat transfer member further comprises:
  a substantially horizontal first portion in close contact with a thermal interfacing material (TIM);
  a substantially horizontal second portion fastened to the enclosure; and
  a third portion coupled between the substantially horizontal first portion and the substantially horizontal second portion.

6. The electronic device of claim 5, wherein heat transferred through the heat dissipation duct is collected by the substantially horizontal first portion and the substantially horizontal second portion.

7. The electronic device of claim 5, wherein the substantially horizontal first portion comprises a ring-shaped protrusion.

8. The electronic device of claim 7, wherein the ring-shaped protrusion protrudes towards the heat dissipation duct.

9. The electronic device of claim 1, wherein the heat dissipation duct comprises:
  a heat collector comprising a first cross-sectional area to collect heat transferred from the at least one first heat transfer member and the second heat transfer member; and
  a heat transfer duct dissipating heat of the heat collector to the plurality of acoustic holes and comprising a second cross-sectional area smaller than the first cross-sectional area.

10. The electronic device of claim 2, further comprising:
  a first heat transfer path dissipating heat generated from the at least one substrate to outside of the plurality of acoustic holes through the at least one first heat transfer member, the at least one TIM, the second heat transfer member, and the heat dissipation duct; and
  a second heat transfer path dissipating heat generated from the power supply to the outside of the plurality of acoustic holes through the at least one first heat transfer member, the at least one TIM, the second heat transfer member, and the heat dissipation duct.

11. The electronic device of claim 1, wherein each of the at least one first heat transfer member and the second heat transfer member includes at least part of an aluminum material or a copper material.

12. The electronic device of claim 2, wherein the at least one TIM comprises a silicon polymer material.

13. The electronic device of claim 1, wherein the second heat transfer member comprises a shape of a hat.

* * * * *